United States Patent [19]
Ono et al.

[11] Patent Number: 5,526,294
[45] Date of Patent: Jun. 11, 1996

[54] CAPACITIVE TOUCH ENTRY APPARATUS USING DRIVE PULSE SIGNALS OF DIFFERENT PHASES

[75] Inventors: Hiroaki Ono; Yoshiki Taketa, both of Osaka; Mikio Nozu, Yamatokouriyama; Hiroshi Senda, Osaka, all of Japan

[73] Assignee: Matsushita Electric Industrial Co., Ltd., Osaka, Japan

[21] Appl. No.: 515,877

[22] Filed: Apr. 27, 1990

[30] Foreign Application Priority Data

Apr. 28, 1989 [JP] Japan .................................. 1-109387

[51] Int. Cl.⁶ .................... H03K 17/955; H03K 17/96
[52] U.S. Cl. .................... 364/709.13; 364/DIG. 1
[58] Field of Search .............. 364/DIG. 2, 928.1, 364/928.2, 928.6, 709.12, 709.13; 341/26, 26, 32, 33; 395/800

[56] References Cited

U.S. PATENT DOCUMENTS

| | | | |
|---|---|---|---|
| 3,668,697 | 6/1972 | Cochran et al. | 341/26 |
| 3,921,166 | 11/1975 | Volpe | 341/26 |
| 4,233,522 | 11/1980 | Grummer et al. | 341/33 |
| 4,237,421 | 12/1980 | Waldron | 328/5 |
| 4,290,052 | 9/1981 | Eichelberger et al. | 341/33 |
| 4,290,061 | 9/1981 | Serrano | 345/174 |
| 4,291,303 | 9/1981 | Cutler et al. | 341/26 |
| 4,305,135 | 12/1981 | Dahl et al. | 341/33 |
| 4,359,720 | 11/1982 | Chai et al. | 341/33 |
| 4,413,252 | 11/1983 | Tyler et al. | 340/365 C |
| 4,543,564 | 9/1985 | Audoin et al. | 341/33 |
| 4,561,002 | 12/1985 | Chiu | 341/33 |
| 4,728,932 | 3/1988 | Atherton | 341/33 |
| 4,733,222 | 3/1988 | Evans | 341/33 |
| 4,806,846 | 2/1989 | Kerder | 324/60 CD |
| 5,053,757 | 10/1991 | Meadows | 340/712 |

FOREIGN PATENT DOCUMENTS

| | | |
|---|---|---|
| 0094130 | 11/1983 | European Pat. Off. . |
| 0187021 | 7/1986 | European Pat. Off. . |
| 0248712 | 12/1987 | European Pat. Off. . |
| 0868739 | 9/1981 | U.S.S.R. . |

*Primary Examiner*—William M. Treat
*Attorney, Agent, or Firm*—Pollock, Vande Sande & Priddy

[57] ABSTRACT

A key input device includes first and second key input electrodes being close to each other and being accessible by a finger of an operator. First and second signal input electrodes oppose the first and second key input electrodes respectively. A first signal is applied to the first signal input electrode. A second signal is applied to the second signal input electrode. The first signal and the second signal have different phases.

6 Claims, 2 Drawing Sheets

CAPACITIVE TOUCH ENTRY APPARATUS USING DRIVE PULSE SIGNALS OF DIFFERENT PHASES

BACKGROUND OF THE INVENTION

This invention relates to a key input device of a capacitance detecting type.

A conventional key input device of the capacitance detecting type includes exposed conductive electrodes which can be touched by fingers of an operator. When an electrode is touched by a finger of the operator, a capacitance related to the electrode is varied. The key input device includes a circuit which functions to detect such a variation in the capacitance. This circuit generates a signal representing whether or not the electrode is touched.

In a prior-art key input device of the capacitance detecting type, as conductive electrodes are close to each other, a touch to one electrode tends to cause a wrong signal representing that a neighboring electrode is touched. Capacitances between the electrodes increase as the electrodes are close to each other. Increased capacitances between the electrodes are a major factor in the causation of such a wrong signal.

SUMMARY OF THE INVENTION

It is an object of this invention to provide an accurate key input device.

According to a first aspect of this invention, a key input device comprises a base; a plurality of key input electrodes formed on a first surface of the base; signal input electrodes opposing the key input electrodes respectively and formed on a second surface of the base, the signal input electrodes being separated into a first group and a second group; signal output electrodes opposing the key input electrodes respectively and formed on the second surface of the base; an oscillator generating a constant-frequency signal and feeding the constant-frequency signal to the signal input electrodes in the first group; a phase inverter inverting a phase of the constant-frequency signal and generating an inversion of the constant-frequency signal, the phase inverter feeding the inversion of the constant-frequency signal to the signal input electrodes in the second group; and detectors detecting levels of signals induced at the signal output electrodes respectively.

According to a second aspect of this invention, a key input device comprises first and second key input electrodes being close to each other and being accessible by a finger of an operator; first and second signal input electrodes opposing the first and second key input electrodes respectively; means for generating a first signal having a phase; means for applying the first signal to the first signal input electrode; means for generating a second signal having a phase different from the phase of the first signal; and means for applying the second signal to the second signal input electrode.

According to a third aspect of this invention, a key input device comprises first and second key input electrodes being close to each other and being accessible by a finger of an operator; first and second signal input electrodes opposing the first and second key input electrodes respectively; first and second signal output electrodes opposing the first and second key input electrodes respectively; means for generating a first signal having a phase; means for applying the first signal to the first signal input electrode; means for generating a second signal having a phase different from the phase of the first signal; means for applying the second signal to the second signal input electrode; means for detecting a signal induced at the first signal output electrode; and means for detecting a signal induced at the second signal output electrode.

DESCRIPTION OF THE PREFERRED EMBODIMENTS

Figure 1:
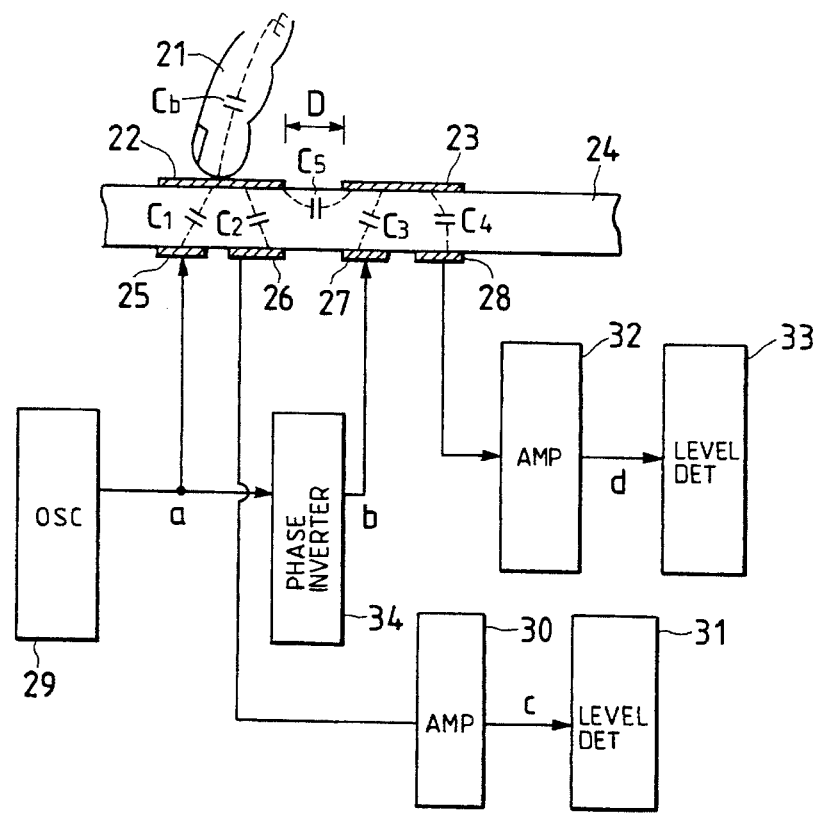
FIG 1 is a diagram of a key input device according to an embodiment of this invention.

With reference to FIG. 1, a key input device includes exposed conductive electrodes 22 and 23 which are accessible by a finger 21 of an operator having a body capacitance Cb. The electrodes 22 and 23 will be referred to as key input electrodes hereinafter. The key input electrodes 22 and 23 are close to each other and are separated by a small distance D. As will be described later, each of the key input electrodes 22 and 23 is associated with a pair of a signal input electrode and a signal output electrode. The key input electrodes 22 and 23 are formed on an upper surface of a glass plate 24. Signal input electrodes 25 and 27 formed on a lower surface of the glass plate 24 oppose the key input electrodes 22 and 28 respectively. Signal output electrodes 26 and 28 formed on the lower surface of the glass plate 24 oppose the key input electrodes 22 and 23 respectively.

An oscillator 29 outputs a signal "a" having a constant amplitude and a predetermined constant frequency in the range of, for example, 5–100 kHz. As shown in the part (a) of FIG. 2, the oscillator signal "a" has a rectangular waveform. The oscillator signal "a" is applied to the signal input electrode 25 and the input terminal of a phase inverter 34. The device 34 inverts the phase of the oscillator signal "a" and thereby generates a signal "b". As shown in the part (b) of FIG. 2, the inverter signal "b" is similar in frequency and waveform to the oscillator signal "a" but the phase of the inverter signal "b" differs from the phase of the oscillator signal "a" by 180 degrees. The inverter signal "b" is applied to the signal input electrode 27. In this way, the signal input electrodes 25 and 27 are subjected to signals having opposite phases.

A signal induced at the signal output electrode 26 is enlarged by an amplifier 30. The amplifier 30 outputs a signal "c" to a level detector 31. The signal "c" takes a waveform such as shown in the part (c) of FIG. 2. The level detector 31 compares the level or amplitude of the signal "c" with a predetermined reference level to detect whether or not the key input electrode 22 is touched by the finger 21 of the operator.

A signal induced at the signal output electrode 28 is enlarged by an amplifier 32. The amplifier 32 outputs a signal "d" to a level detector 33. The signal "d" takes a waveform such as shown in the part (d) of FIG. 2. The level detector 33 compares the level or amplitude of the signal "d" with a predetermined reference level to detect whether or not the key input electrode 23 is touched by the finger 21 of the operator.

The key input device operates as follows. The oscillator signal "a" travels from the signal input electrode 2S to the key input electrode 22 via a capacitance C1 between the electrodes 22 and 25, and then travels from the key input electrode 22 to the signal output electrode 26 via a capacitance C2 between the electrodes 22 and 26. Thus, a signal reflecting oscillator signal "a" is induced at the signal electrode 26. The induced signal is enlarged by the amplifier 30 into the signal "c" The level of the signal "c" is compared with the reference level by the level detector 31. The inverter signal "b" travels from the signal input electrode 27 to the key input electrode 23 via a capacitance C3 between the electrodes 23 and 27, and then travels from the key input electrode 23 to the signal output electrode 28 via a capacitance C4 between the electrodes 23 and 28. Thus, a signal reflecting inverter signal "b" is induced at the signal output electrode 28. The induced signal is enlarged by the level amplifier 32 into the signal "d". The level of the signal "d" is compared with the reference level by the level detector 33.

Figure 2:
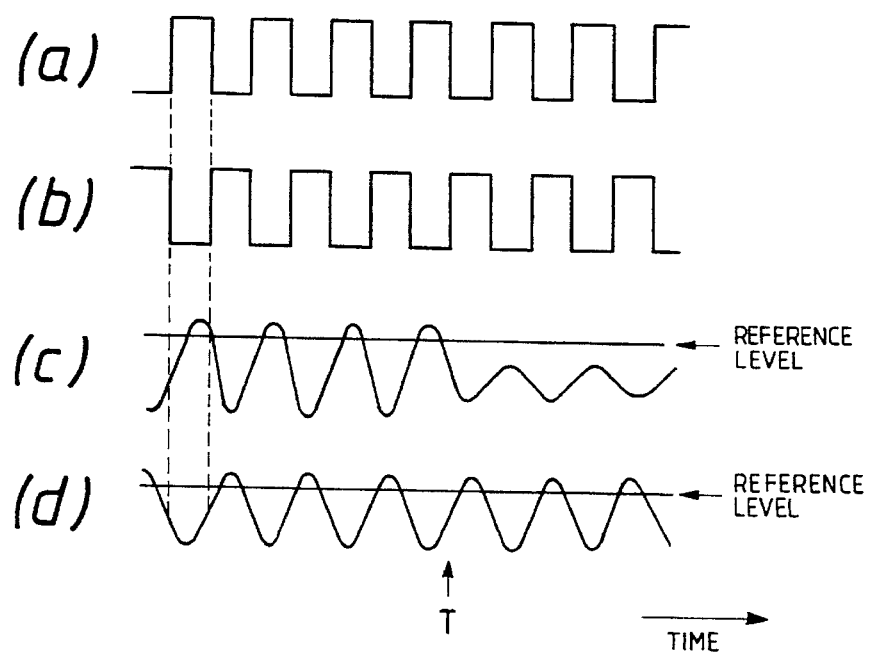
FIG. 2 is a timing diagram showing the waveforms of various signals in the key input device of FIG. 1.

It is now assumed that the finger 21 of the operator touches the key input electrode 22 at a moment T and then the finger 21 continues to touch the key input electrode 22. During a period until the moment T, the levels of the signals "c" and "d" are larger than the reference levels as shown in FIG. 2 so that the level detectors 31 and 33 detect that the key input electrodes 22 and 23 are not touched by any fingers. At the moment T, the finger 21 of the operator touches the key input electrode 22, and thus the body capacitance Cb of the operator is connected to the key input electrode 22. The connection of the body capacitance Cb to the key input electrode 22 causes a drop in the amplitude of a signal induced at the key input electrode 22 so that the signal induced at the signal output electrode 26 also decreases in level. Thus, the level of the signal "c" drops below the reference level and the level detector 31 detects That the key input electrode 22 is touched by a finger. After the moment T, the finger 21 of the operator continues to touch the key input electrode 22 and the level of the signal "c" remains smaller than the reference level so that the level detector 31 detects that the key input electrode 22 is continuously touched by a finger.

There is a stray capacitance C5 between the key input electrodes 22 and 23. In a prior-art key input device where signal input electronics 25 anal 27 are subjected to a common oscillator signal or subjected to signals having equal phases respectively, when a finger 21 of an operator touches a key input electrode 22, the stray capacitance C5 between the key input electrode 22 and a key input electrode 23 tends to cause a considerable drop in the level of a signal "d" and thus a level detector 33 is liable to perform wrong detection indicating that the key input electrode 23 is touched by a finger.

In this invention, such an adverse function of the stray capacitance C5 between the key input electrodes 22 and 23 is prevented. Therefore, when the finger 21 of the operator touches the key input electrode 22 at the moment T, the level of the signal "d" remains essentially unchanged as shown in FIG. 2 so that the level detector 33 performs accurate detection. The prevention of the adverse function of the stray capacitance C5 is enabled by feeding the signal input electrodes 25 and 27 with the signals having opposite phases.

This embodiment may be modified as follows. In a modification of the embodiment, the phase inverter 34 is replaced by a phase shifter and the signal input electrodes 25 and 27 are fed with signals having different phases.

Figure 3:
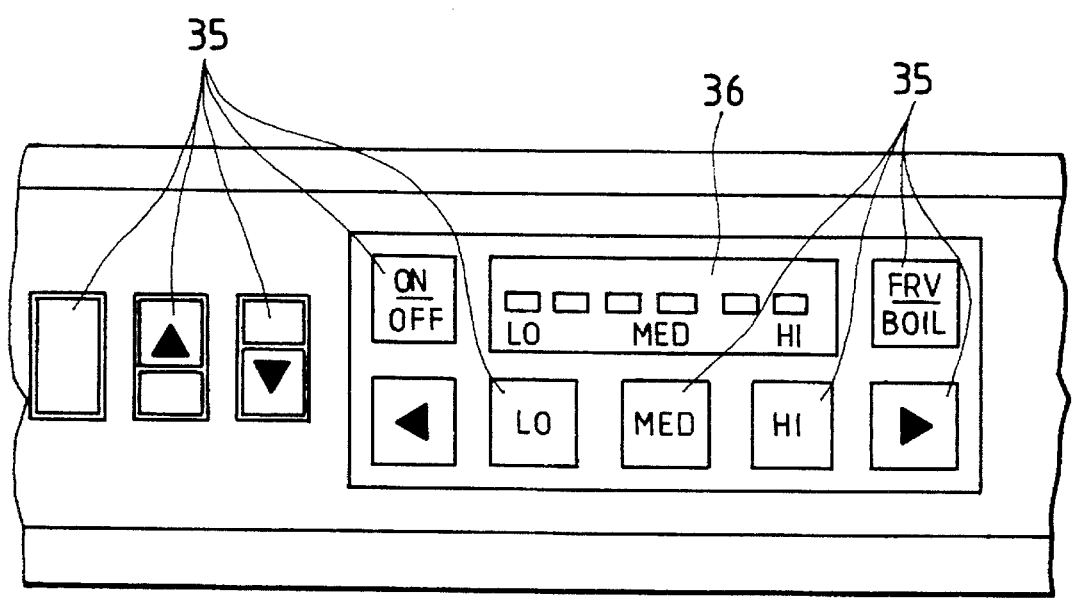
FIG. 3 is a plan view of a part of a cooking apparatus provided with a key input device according to another embodiment of this invention.

FIG. 3 shows another embodiment of this invention which is similar to the embodiment of FIG. 1 except for design changes indicated hereinafter. With reference to FIG. 3, an operation panel of a cooking apparatus is provided with a switch section and a display section 36. The switch section includes a key input device. The key input device has a plurality of key input electrodes 35 arranged on an upper surface of a base plate. Each of the key input electrodes 35 is associated with a signal input electrode and a signal output electrode (both not shown) formed on a lower surface of the base plate. The key input electrodes 35, the signal input electrodes, and the signal output electrodes are separated into first and second groups. The key input electrodes 35 in the first group are scanned by sequentially applying a first signal to the signal input electrodes in the first group and by detecting an induced signal at the signal output electrodes in the first group for respective scan periods. Similarly, the key input electrodes 35 in the second group are scanned by sequentially applying a second signal to the signal input electrodes in the second group and by detecting an induced signal at the signal output electrodes in the second group for respective scan periods. During each scan period, one of the signal input electrodes in the first group and one of the signal input electrodes in the second group are subjected to the first signal and the second signal respectively. The first signal and the second signal have equal frequencies but have opposite phases.

In respect to the embodiment of FIG. 3, experiments were performed as follows. A probe was prepared. The probe included a square metal plate having a size of 6 mm by 6 mm. The metal plate was grounded via a parallel combination of a capacitor of 70 picofarads and a resistor of 200 kilo-ohms. In the experiments, a human finger touch to a key input electrode 35 was replaced by a touch of the probe metal plate to the key input electrode 35. When one key input electrode in the first group was touched by the probe, the level of an induced signal at a signal output electrode in the second group was not dropped and was increased by about 0.3 to 0.5 volt.

Similar experiments were performed in an arrangement corresponding to a prior art design where the first signal and the second signal have equal phases. In these experiments, when one key input electrode in the first group was touched by the probe, the level of an induced signal at a signal output electrode in the second group was dropped by about 0.3 to 0.5 volt. This level drop tended to cause wrong detection indicating that a key input electrode in the second group was touched.

The experiments also revealed the following fact. The difference in level between the induced signals at an output electrode which occurred in the presence and absence of a touch to the related key input electrode in the embodiment of FIG. 3 was greater than that in the arrangement corresponding to the prior art design by 0.3–0.5 volt.

What is claimed is:

1. A key input device comprising:

a dielectric base;

a plurality of spaced key input electrodes formed on a first surface of the base;

spaced signal input electrodes formed on an opposite surface of the base and respectively positioned in opposing relation to the key input electrodes, the signal input electrodes being separated into first and second groups;

signal output electrodes formed on the opposite surface of the base and respectively positioned in opposing relation to the key input electrodes, the signal output electrodes being separated into first and second groups spaced from corresponding groups of the signal input electrodes;

oscillation means for delivering a constant frequency signal to the signal input electrodes of the first group;

phase shifting means connected between the oscillation means and the second group of signal input electrodes for providing them with a phase shifted constant frequency signal; and a plurality of level detecting means connected to respective signal output electrodes for detecting any voltage change thereat, which exceeds a threshold reference level—indicative of capacitive coupling contact with a key input electrode in excess of stray capacitance between key input electrodes.

2. The device set forth in claim 1 wherein the base comprises a glass plate.

3. The device set forth in claim 1 wherein the constant frequency signal has a frequency of 5–100 kHz.

4. A key input device comprising:

a dielectric base;

a plurality of spaced key input electrodes formed on a first surface of the base;

spaced signal input electrodes formed on an opposite surface of the base and respectively positioned in opposing relation to the key input electrodes, the signal input electrodes being separated into first and second groups;

signal output electrodes formed on the opposite surface of the base and respectively positioned in opposing relation to the key input electrodes, the signal output electrodes being separated into first and second groups spaced from corresponding groups of the signal input electrodes;

oscillation means for delivering a constant frequency signal to the signal input electrodes of the first group;

phase inversion means connected between the oscillation means and the second group of signal input electrodes for providing them with a phase inverted constant frequency signal; and a plurality of level detecting means connected to respective signal output electrodes for detecting any voltage change thereat, which exceeds a threshold reference level—indicative of capacitive coupling contact with a key input electrode in excess of stray capacitance between key input electrodes.

5. The device set forth in claim 4 wherein the base comprises a glass plate.

6. The device set forth in claim 4 wherein the constant frequency signal has a frequency of 5–100 kHz.

* * * * *